(12) United States Patent  
Yamashita et al.

(10) Patent No.: US 8,829,333 B2  
(45) Date of Patent: Sep. 9, 2014

(54) SOLAR CELL MODULE AND METHOD FOR MANUFACTURING SAME

(75) Inventors: Mitsuo Yamashita, Omihachiman (JP); Takeshi Kyouda, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 31 days.

(21) Appl. No.: 13/580,665

(22) PCT Filed: Feb. 24, 2011

(86) PCT No.: PCT/JP2011/054179  
§ 371 (c)(1),  
(2), (4) Date: Aug. 22, 2012

(87) PCT Pub. No.: WO2011/105510  
PCT Pub. Date: Sep. 1, 2011

(65) Prior Publication Data  
US 2012/0312358 A1 Dec. 13, 2012

(30) Foreign Application Priority Data  
Feb. 24, 2010 (JP) .................................. 2010-039010

(51) Int. Cl.  
*H01L 31/05* (2014.01)  
*H01L 31/048* (2014.01)

(52) U.S. Cl.  
CPC .......... *H01L 31/048* (2013.01); *H01L 31/0508* (2013.01); *Y02E 10/52* (2013.01); *H01L 31/0504* (2013.01); *H01L 31/0516* (2013.01)  
USPC ............... 136/251; 136/244; 438/64; 438/66; 438/67

(58) Field of Classification Search  
CPC .......... H01L 31/0504–31/0508; H01L 31/0516  
USPC ................................................... 136/243–265  
See application file for complete search history.

(56) References Cited

U.S. PATENT DOCUMENTS 6,291,761 B1 * 9/2001 Takada et al. .................. 136/244  
6,395,972 B1 * 5/2002 Tran et al. ...................... 136/251  
(Continued)

FOREIGN PATENT DOCUMENTS

JP S62-205670 A 9/1987  
JP H01-161345 U 11/1989  
(Continued)

OTHER PUBLICATIONS

JP 08-298334 machine translation.*  
International Search Report dated May 24, 2011, issued for International Application No. PCT/JP2011/054179.

* cited by examiner

*Primary Examiner* — James Lin  
*Assistant Examiner* — Liesl C Baumann  
(74) *Attorney, Agent, or Firm* — Procopio, Cory, Hargreaves & Savitch LLP

(57) ABSTRACT

A highly reliable solar cell module and method for manufacturing same are disclosed. The solar cell module is provided with first and second solar cell elements, each of which has a semiconductor substrate and an output taking out electrode; a circuit film which electrically connects together the first solar cell element and the second solar cell element; and a sealing material disposed between the circuit film and the second surface of the first and the second solar cell elements. The sealing material has a through hole, and the circuit film has: a base sheet having a protruding section which protrudes toward the second surface of the solar cell element; and a wiring conductor which electrically connects the output taking out electrode of the first solar cell element and the output taking out electrode of the second solar cell element.

5 Claims, 11 Drawing Sheets

(56) References Cited

U.S. PATENT DOCUMENTS

| | | |
|---|---|---|
| 2002/0063290 A1 | 5/2002 | Ishii et al. |
| 2007/0283996 A1* | 12/2007 | Hachtmann et al. ........... 136/244 |
| 2007/0283997 A1* | 12/2007 | Hachtmann et al. ........... 136/244 |
| 2009/0014049 A1* | 1/2009 | Gur et al. ...................... 136/244 |
| 2009/0065043 A1 | 3/2009 | Hadorn et al. |
| 2009/0159119 A1* | 6/2009 | Basol ............................ 136/251 |
| 2009/0272419 A1 | 11/2009 | Sakamoto et al. |
| 2012/0037203 A1* | 2/2012 | Sainoo et al. ................. 136/244 |

FOREIGN PATENT DOCUMENTS

| | | |
|---|---|---|
| JP | H08-298334 A | 11/1996 |
| JP | 2002-319629 A | 10/2002 |
| JP | 2009-527917 A | 7/2009 |
| WO | 2008/078741 A1 | 7/2008 |

6

SOLAR CELL MODULE AND METHOD FOR MANUFACTURING SAME

FIELD OF ART

The present invention relates to a solar cell module and a method for manufacturing same.

BACKGROUND ART

A solar cell module constituting a single unit in a solar power generating system is typically manufactured by arranging, in order, a light-receiving-side sealing member, a photoelectric converter, a non-light-receiving-side sealing member, and a protective sheet in stacked fashion above a glass substrate, and applying heat and pressure thereto. At this time, resin, for example, is employed at the light-receiving-side sealing member and the non-light-receiving-side sealing member, and a plurality of solar cell elements which are electrically connected by inner leads or other such conductive leads are employed at the photoelectric converter.

Because each and every one of the many solar cell elements are connected by means of inner leads in such solar cell module manufacturing methods, operations become complicated, and further improvements in manufacturing efficiency are required.

To solve this problem, International Patent Application Japanese Translation Publication No. 2009-527917 and Japanese Patent Application Publication Kokai No. 2002-319691 propose simplification of manufacturing operations by causing solar cell elements to be mutually connected by means of a film-type circuit in which conductive leads are arranged on film.

However, in the manufacturing method described at International Patent Application Japanese Translation Publication No. 2009-527917, wave soldering is employed to solder the solar cell elements and film-type circuit, and thus obtain the device structure. Said device structure, glass substrate, sealing member, and protective sheet are then formed into an integral structure to manufacture the solar cell module. Because wave soldering is a method in which soldering takes place by means of solder jetted from the interior of a solder bath, it is necessary during the aforementioned manufacturing method to heat the solar cell element and the film-type circuit to a temperature sufficient to cause these to be wetted by solder. Thermal history is also significant, since the solder jet heats the solar cell element over a large area thereof. Because heating takes place over a large area, there is a tendency for warping of the device structure to occur during cooling following soldering, and there has been a possibility that cracking of the solar cell element may occur when this is stretched and made flat at the time that this is made into an integral structure together with the glass substrate and so forth.

Furthermore, in the manufacturing method described at Japanese Patent Application Publication Kokai No. 2002-319691, the sealing member is integral with the film-type circuit, a plurality of solar cell elements being electrically connected without causing the sealing member to undergo melting or crosslinking. This being the case, reliability of the electrical connection has been poor, and the manufacturing operations, which include an operation in which the film-type circuit is folded back upon itself and so forth, have been extremely complicated.

SUMMARY OF THE INVENTION

It is an object of the present invention to provide a solar cell module which has simple structure and which permits good reliability and manufacturing efficiency, as well as a method for manufacturing same.

A solar cell module according to one embodiment of the present invention is provided with mutually adjacent first and second solar cell elements, a film-type circuit, and a sealing member. First and second solar cell elements are each provided with a semiconductor substrate comprising a first surface which receives light and a second surface which corresponds to the back surface of the first surface, and with an output-extracting electrode located on the second surface. The film-type circuit electrically connects the output-extracting electrode of the first solar cell element and the output-extracting electrode of the second solar cell element. The sealing member has through-holes and is disposed between the film-type circuit and the second surfaces of the first and second solar cell element. In addition, the film-type circuit is provided with a sheet-like substrate comprising a convex portion which protrudes toward the second surface, and is provided with a conductive lead disposed on an apical surface of the convex portion. In addition, the conductive lead electrically connects the output-extracting electrode of the first solar cell element and the output-extracting electrode of the second solar cell element by way of the joint member disposed within the through-hole.

A solar cell module manufacturing method according to another embodiment of the present invention comprises an operation in which a plurality of solar cell elements arrayed in mutually adjacent fashion are prepared, each of the solar cell elements comprising a semiconductor substrate comprising a first surface that receives light and a second surface corresponding to a back surface of the first surface, and an output-extracting electrode located on the second surface; a perforating operation in which a through-hole is provided at a sealing member material, the sealing member material comprising a front surface and a back surface, the through-hole extending from the front surface to the back surface; an aligning operation in which a film-type circuit comprising a sheet-like substrate comprising a convex portion on one principal plane thereof and a conductive lead disposed on an apical surface of the convex portion are arranged relative to the sealing member material in such fashion as to cause the convex portion to be located within the through-hole; a connecting operation in which the output-extracting electrode of a first solar cell element and the output-extracting electrode of a second solar cell element adjacent to the first solar cell element are electrically connected by the conductive lead by way of a joint member; and a heat treatment operation in which the sealing member material is subjected to heat treatment to form a sealing member.

In accordance with a solar cell module according to one embodiment of the present invention, the sheet-like substrate of the film-type circuit has a convex portion which protrudes toward the second surface of the solar cell element, a conductive lead being arranged on the apical surface of the convex portion. This makes it possible for the thickness of the joint member which is located between the solar cell element and the conductive lead to be made smaller than the thickness of the sealing member which is disposed between the film-type circuit and the second surface of the solar cell element. As a result, it is possible by means of a simple structure to increase the strength of the joint between the solar cell element and the conductive lead, and to reduce occurrence of cracking and delamination which tends to occur at the joint member when the joint member is too thick.

BRIEF DESCRIPTION OF THE DRAWINGS

FIG. 3 (b) is a view showing an enlarged model of portion C at FIG. 3 (a) in a situation where electrically conductive adhesive is used as a joint member; and FIG. 3 (c) is a cross-sectional view of section D-D' at FIG. 1 (a).

FIG. 5 (b) is a cross-sectional view of section F-F' in FIG. 2 showing a film-type circuit; FIG. 5 (c) is a drawing corresponding to the cross-sectional view of section E-E' in FIG. 2 showing a variation on film-type circuit in solar cell module 1 according to the first embodiment; and FIG. 5 (d) is a drawing corresponding to the cross-sectional view of section F-F' in FIG. 2 which is another variation on the film-type circuit shown at FIG. 5 (c).

FIG. 7 (b) is a view showing a model of the situation that exists when a laminator is used to subject the module laminate stack to heat treatment so as to manufacture the solar cell module.

EMBODIMENTS FOR PRACTICING THE INVENTION

Below, solar cell modules according to embodiments of the present invention are described with reference to the attached drawings.

First Embodiment

Figure 1:
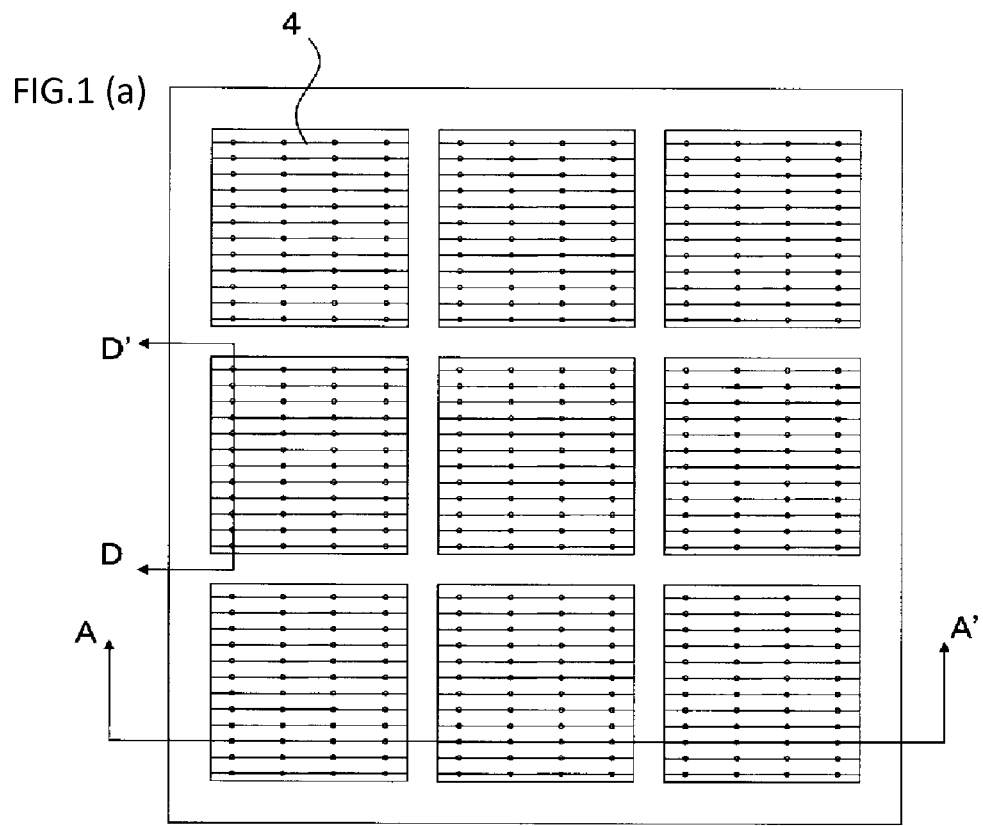
FIG. 1 is a group of drawings showing solar cell module 1 according to a first embodiment of the present invention, FIG. 1 (a) being a plan view as seen from the light-receiving side, and FIG. 1 (b) being a cross-sectional view of section A-A' at FIG. 1 (a).
Figure 1:
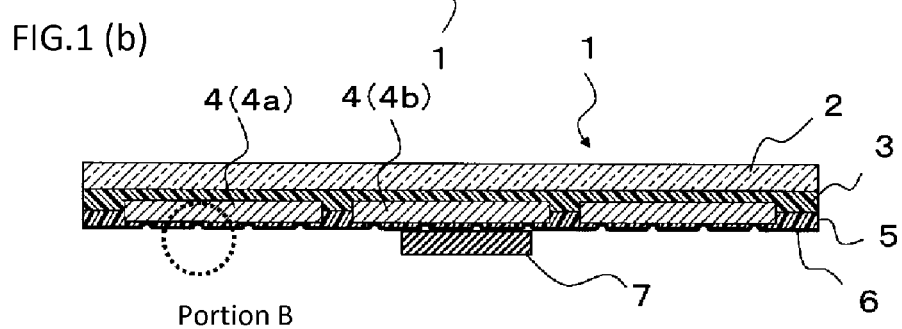
Figure 2:
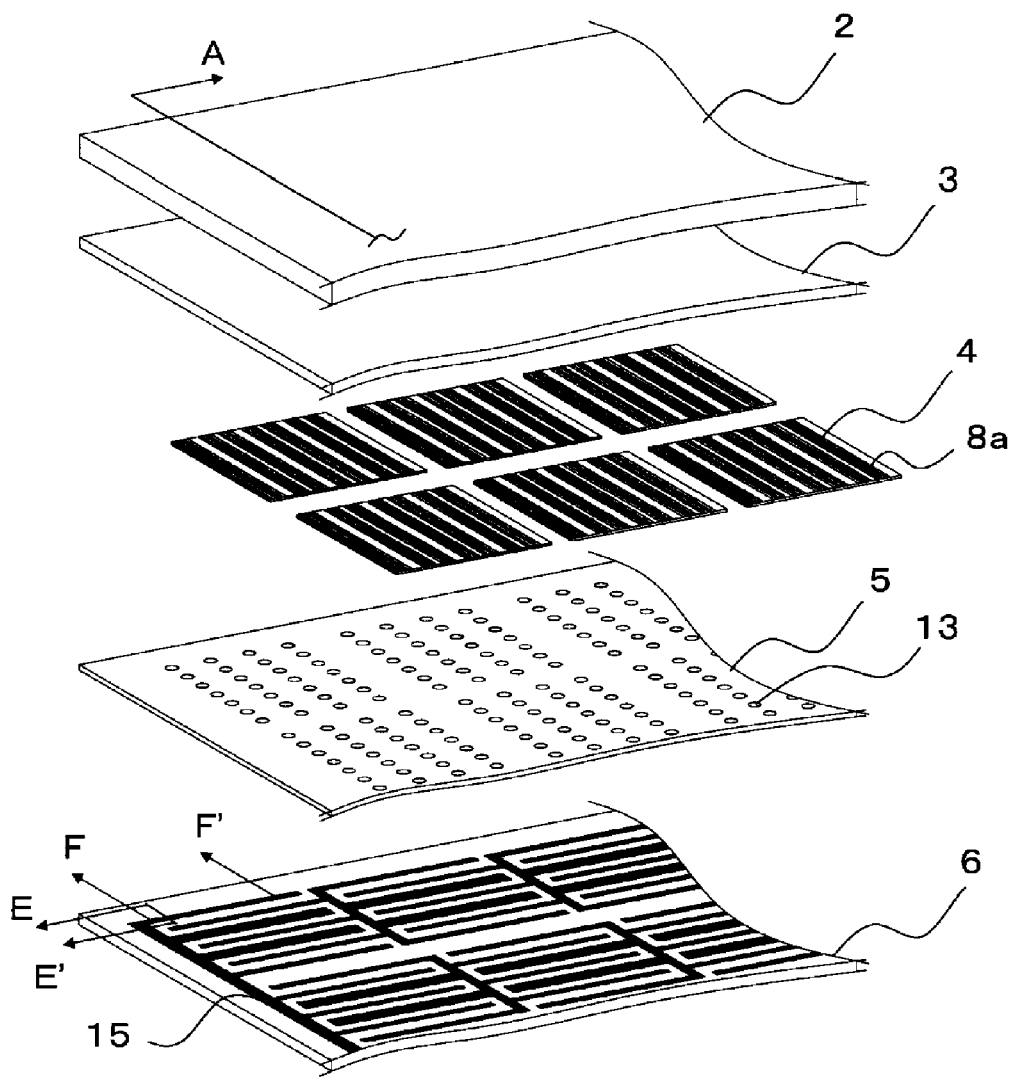
FIG. 2 is an exploded perspective view showing laminated constitution of solar cell module 1 according to a first embodiment of the present invention.
Figure 3:
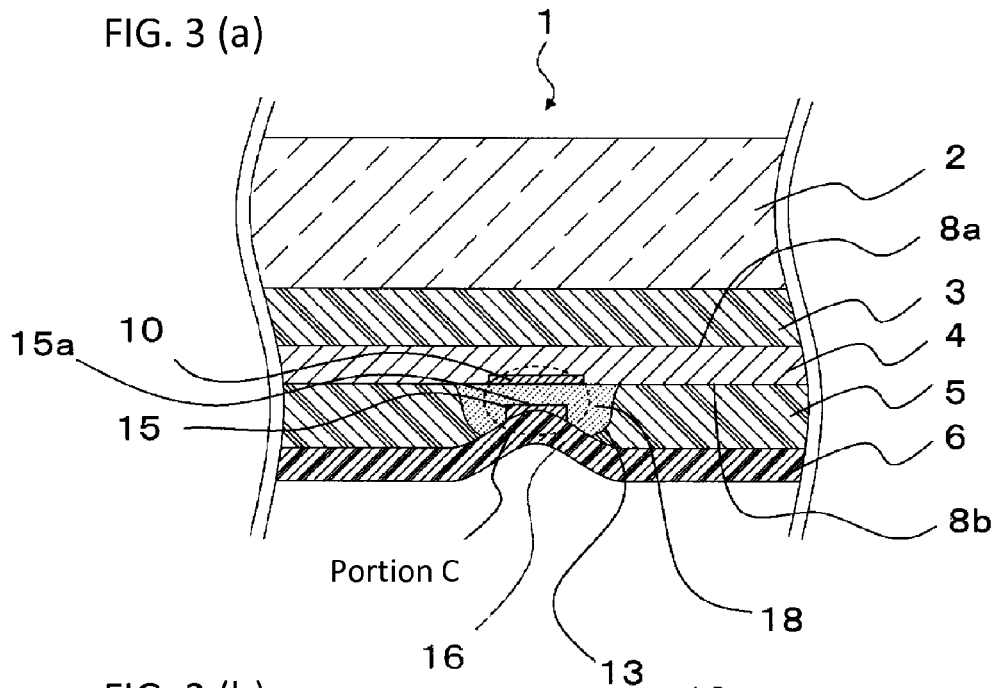
FIG. 3 (a) is an enlarged cross-sectional view of portion B at FIG. 1 (b)
Figure 3:
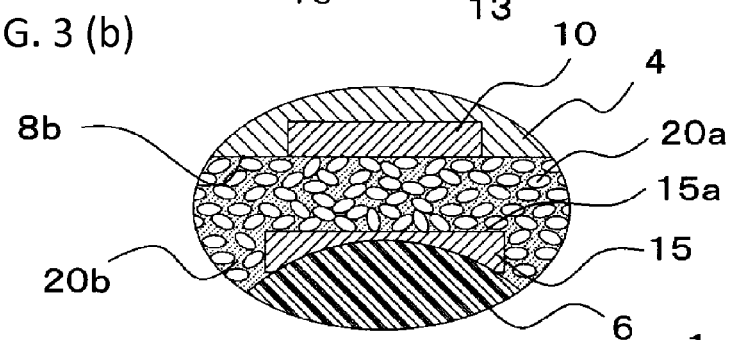
Figure 3:
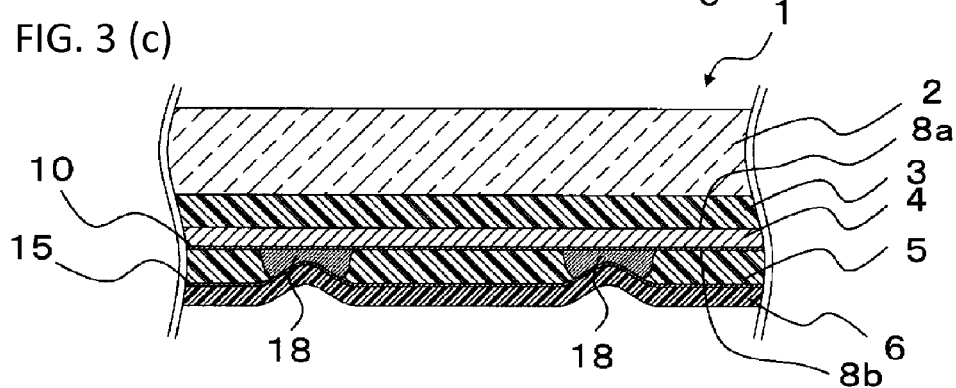

As shown in FIG. 1 through FIG. 3, solar cell module 1 according to a first embodiment of the present invention is provided with, in order from the light-receiving side thereof, translucent substrate 2; light-receiving-side sealing member 3; solar cell elements 4 (first solar cell element 4a and second solar cell element 4b); non-light-receiving-side sealing member 5; film-type circuit 6; and terminal box 7. Translucent substrate 2 functions as substrate for solar cell module 1. Film-type circuit 6 is for electrically interconnecting solar cell elements 4. Terminal box 7, which adheres to the back surface of film-type circuit 6, has the function of extracting output to the exterior.

In the present embodiment, in addition to the function of electrically interconnecting solar cell elements 4, film-type circuit 6 also has the function of protecting the back surface of solar cell module 1.

Described below are components of solar cell module 1 according to the present embodiment.

Translucent Substrate

Translucent substrate 2 has the function of protecting solar cell elements 4 and/or other components from the exterior. Furthermore, light from the exterior is incident on translucent substrate 2. There is therefore no particular limitation with regard to material(s) employed for translucent substrate 2, so long as such component(s) permit light to be incident on solar cell elements 4. As translucent substrate 2, water-white crown glass, tempered glass, heat-strengthened glass, solar reflective glass, or other such glass materials, or polycarbonate or other such resin materials or the like which has high optical transmittance may, for example, be employed. Thickness of translucent substrate 2 may, for example, be on the order of 3 mm to 5 mm if water-white crown glass or tempered glass is used, or may be on the order of 5 mm if polycarbonate resin or other such synthetic resin is used.

Light-Receiving-Side Sealing Member

Light-receiving-side sealing member 3 has the function of sealing the light-receiving side of solar cell elements 4. As material for light-receiving-side sealing member 3, an organic compound having transparent ethylene-vinyl acetate copolymer (EVA) or polyvinyl butyral (PVB) as primary constituent may, for example, be employed. Light-receiving-side sealing member 3, for example, is obtained by using a T die and extruder to form the foregoing organic compound into sheets of thickness on the order of 0.4 to 1 mm, and cutting these to appropriate size.

Here, light-receiving-side sealing member 3 may contain crosslinking agent. This crosslinking agent would have the function of causing bonding to occur between molecules of EVA or the like. As crosslinking agent, an organic peroxide that decomposes at a temperature of 70° C. to 180° C. to produce radicals may, for example, be employed. As organic peroxide, 2,5-dimethyl-2,5-bis(t-butylperoxy)hexane, tert-hexyl peroxypivalate, and so forth may, for example, be cited. If EVA is used as light-receiving-side sealing member 3, this may be made to contain crosslinking agent in a relative amount that is on the order of 1 part by weight thereof per 100 parts by weight of EVA.

Besides EVA and PVB, it is also possible to utilize thermosetting resin, or thermoplastic resin containing crosslinking agent and having heat-curable properties, as light-receiving-side sealing member 3. As such resins, acrylic resins, silicone resins, and epoxy resins, as well as EEA (ethylene-ethyl acrylate copolymers) and so forth, may, for example, be cited.

Solar Cell Element

Solar cell element 4 has semiconductor substrate 9 having first surface 8a (light-receiving surface) which serves as principal plane at the side that receives sunlight, and second surface 8b (non-light-receiving surface) which corresponds to the back surface of said first surface 8a. First surface 8a and second surface 8b correspond to the light-receiving surface and the non-light-receiving surface of solar cell element 4.

Figure 4:
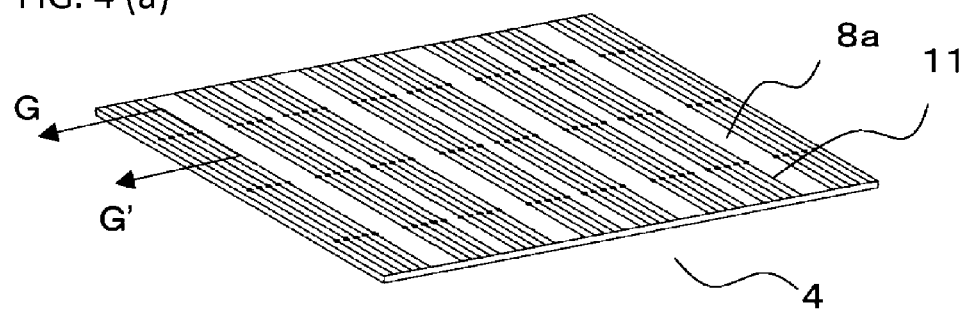
FIG. 4 is a group of drawings showing solar cell element 4 in solar cell module 1 according to a first embodiment of the present invention, FIG. 4 (a) being a perspective view of solar cell element 4 as seen from the first side (light-receiving side) thereof, FIG. 4 (b) being a perspective view of solar cell element 4 as seen from the second side (back side) thereof, FIG. 4 (c) being a cross-sectional view of section G-G' at FIG. 4 (a).
Figure 4:
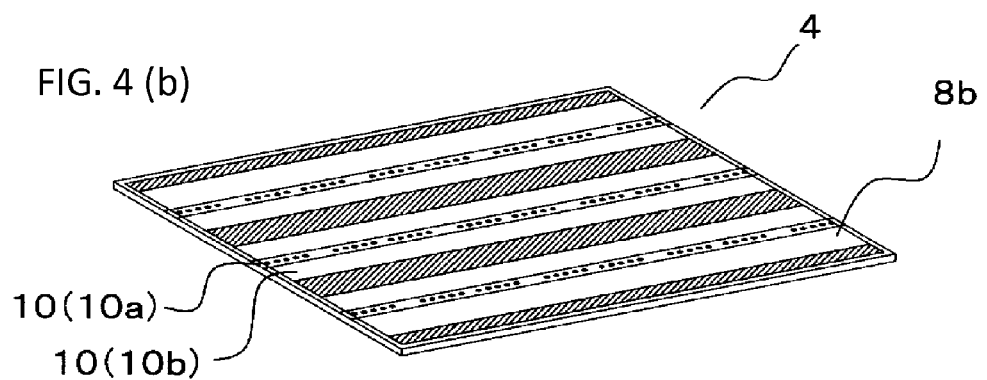
Figure 4:
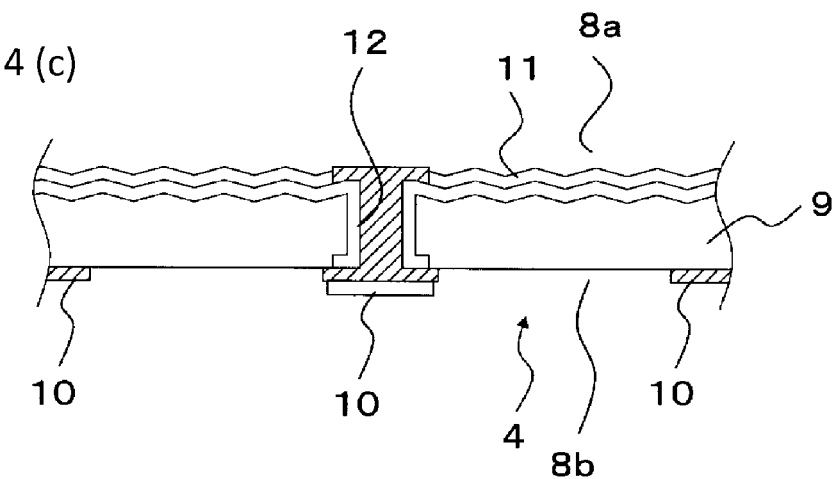

At solar cell module 1 according to the present embodiment, the second surfaces 8b of a plurality of solar cell elements 4 are electrically interconnected by film-type circuit 6. Solar cell element 4 therefore has a back-contact structure. As such back-contact structure, metal wrap-through structures, emitter wrap-through structures, IBC structures, around wrap-through structures, and so forth may, for example, be cited. With regard to the material(s) employed for solar cell element 4, so long it has a back-contact structure, polycrystalline silicon, monocrystalline silicon, and other such crystalline materials; silicon thin films and other such thin-film materials; CIGS, CdTe, and other such chemical-compound-type materials; and so forth may be employed as appropriate. As shown at FIG. 4 (c), note that solar cell element 4 of the present embodiment has a crystalline metal wrap-through structure.

Semiconductor substrate 9, which is made up of monocrystalline silicon substrate or polycrystalline silicon substrate, for example, has at the interior thereof a PN junction between a P layer containing an abundance of boron or other such P-type dopant, and an N-type layer containing an abundance of phosphorous or other such N-type dopant. As such monocrystalline silicon substrate or polycrystalline silicon substrate, a rectangular specimen sliced and sectioned from an ingot formed using silicon feedstock of purity 6N to 11N may, for example, be employed. Such substrate may, for example, be such that thickness thereof is on the order of 0.1 mm to 0.3 mm, and size thereof is on the order of 150 mm to 160 mm, square.

Furthermore, solar cell element 4 is provided with output-extracting electrodes 10 arranged on second surface 8b. Output-extracting electrodes 10 have the function of causing carriers (charge) produced at semiconductor substrate 9 to be output to the exterior. Note that solar cell element 4 may have current-collecting electrodes (not shown) arranged on second surface 8b and electrically connected to output-extracting electrodes 10 so as to permit efficient collection of carriers produced at second surface 8b.

Furthermore, solar cell element 4 may have linear current-collecting electrodes 11 arranged on first surface 8a. Current-collecting electrodes 11 have the function of efficiently collecting carriers produced at first surface 8a.

As shown at FIG. 4 (b) and FIG. 4 (c), output-extracting electrodes 10 comprise two types of electrodes (10a, 10b) of opposite polarity. That is, at output-extracting electrodes 10, one electrode 10a of the electrodes is disposed directly beneath hole 12 and outputs carriers (e.g., electrons) collected at first surface 8a. In contradistinction thereto, the other electrode 10b is disposed on second surface 8b so as to be insulated from the electrode 10a just mentioned and outputs carriers (e.g., holes) collected at second surface 8b. By, for example, arranging them so that they are separated by some distance on second surface 8b, the former electrode 10a and the latter electrode 10b may be mutually insulated.

Note that output-extracting electrodes 10 and current-collecting electrodes 11 may, for example, consist of silver, copper, or other such electrically conductive material, and may be formed by screen printing or other such method. Furthermore, as electrically conductive material with which hole 12 is filled, it is possible to use material equivalent to that used for current-collecting electrodes 11, and this may be formed by the aforementioned screen printing method at the same operation as for current-collecting electrodes 11.

Note that detailed constituents of the aforementioned solar cell element 4 are not shown in sectional views showing sections of solar cell modules in the present specification such as at FIG. 1 (b) and so forth.

Non-Light-Receiving-Side Sealing Member

Non-light-receiving-side sealing member 5 has the function of cooperating with light-receiving-side sealing member 3 to protect solar cell element 4. Non-light-receiving-side sealing member 5 is disposed between film-type circuit 6, described below, and second surface 8b of solar cell element 4. As material for non-light-receiving-side sealing member 5, materials similar to those used for light-receiving-side sealing member may, for example, be employed. Note that resins other than those which are transparent may be used for non-light-receiving-side sealing member 5. For example, at non-light-receiving-side sealing member 5, resin which has been given a white color may be used to increase the amount of electric power generated by solar cell module 1, or resin which has been given a color compatible with that of solar cell element 4 may be used to improve the design characteristics of solar cell module 1.

Furthermore, non-light-receiving-side sealing member 5 is not limited to single-layer members, it being possible to employ multiple-layer members or members in which insulating particles have been kneaded into EVA, PVB, and/or the like therefor. For example, if laminate constitution is EVA/PET/EVA, a member including a resin layer that does not melt at the laminating temperature may be employed as the PET serving as intermediate layer, or a member in which silica particles have been kneaded may be employed as the EVA. Employment of such a non-light-receiving-side sealing member 5 will make it possible to improve insulating characteristics at regions other than through-holes 13, and to reduce contact between solar cell element 4 and film-type circuit 6 at regions where this would be unnecessary or undesirable. As a result, it is possible to reduce occurrence of short circuits.

With regard to thickness of non-light-receiving-side sealing member 5, note that it is sufficient so long as protection of solar cell element 4 is permitted; for example, where thickness of solar cell element 4 is 0.1 mm to 0.3 mm, this may be 0.3 mm to 0.8 mm.

Furthermore, non-light-receiving-side sealing member 5 has through-holes 13 for electrically connecting output-extracting electrodes 10 of solar cell element 4 and conductive leads 15 of film-type circuit 6. Through-holes 13 are provided at locations opposed to output-extracting electrodes 10 of solar cell element 4. To reduce concentration of stresses, through-holes 13 may, for example, be through-holes having circular or oval openings. Furthermore, it is possible to appropriately select through-hole 13 projected area within the range 20 $mm^2$ to 600 $mm^2$, in correspondence to dimensions of conductive leads 15, size of solar cell element 4, and so forth.

Film-Type Circuit

Film-type circuit 6 is for electrically interconnecting solar cell elements 4 arranged in adjacent fashion. Furthermore, in the present embodiment, this also has the function of protecting non-light-receiving-side sealing member 5 and solar cell elements 4.

Figure 5:
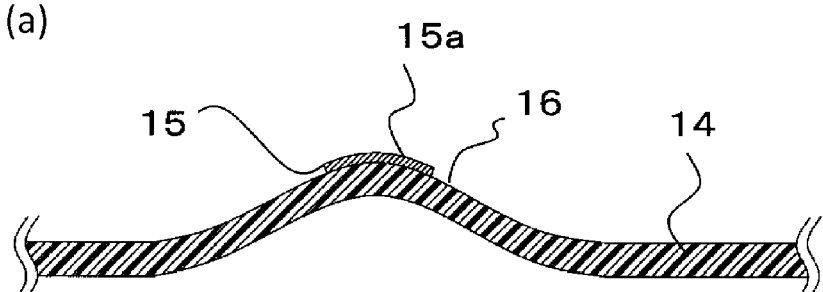
FIG. 5 (a) is a cross-sectional view of section E-E' in FIG. 2 showing film-type circuit in solar cell module 1 according to a first embodiment of the present invention.
Figure 5:
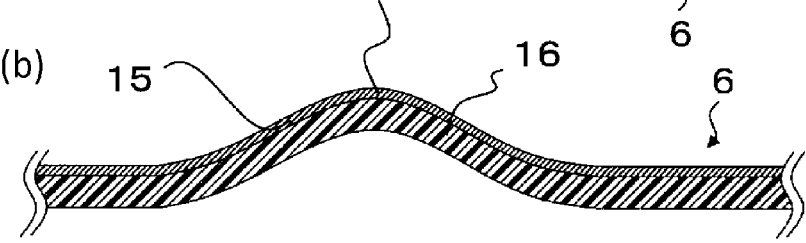
Figure 5:
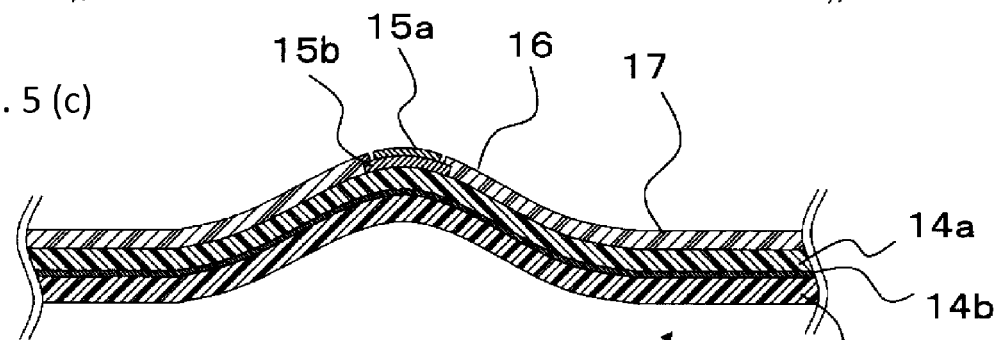
Figure 5:
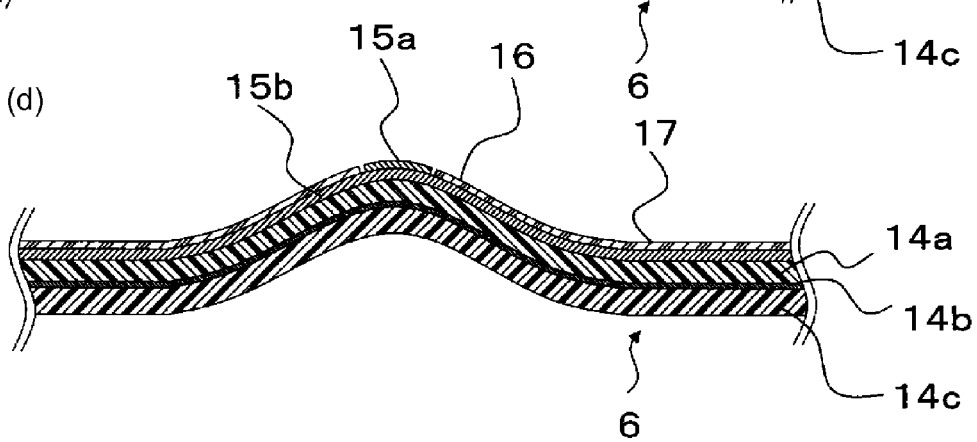

As shown at FIG. 5 (a) and FIG. 5 (b), film-type circuit 6 is provided with sheet-like substrate 14 and conductive leads 15. Sheet-like substrate 14 has, on one principal plane thereof, convex portion 16 which protrudes toward second surface 8b of solar cell element 4. Convex portion 16 of sheet-like substrate 14 may be formed by subjecting film-type circuit 6 including sheet-like substrate 14 and conductive leads 15 to bulging with using press working which is a type of plastic forming operation Conductive lead 15 electrically connects adjacently arranged positive output-extracting electrode 10 (10a) of first solar cell element 4a and negative output-extracting electrode 10 (10b) of second solar cell element 4b. More specifically, as shown at FIG. 5 (a) and FIG. 5 (b), conductive lead 15 electrically connects positive output-extracting electrode 10a of first solar cell element 4a and negative output-extracting electrode 10b of second solar cell element 4b by way of joint member 18 disposed within through-hole 13 of non-light-receiving-side sealing member 5. This conductive lead 15 is arranged at the apical surface of convex portion 16 provided on one principal plane of sheet-like substrate 14, being provided at a location opposed to output-extracting electrode 10 of solar cell element 4. In addition, conductive lead 15 has contact region 15a which faces non-light-receiving-side sealing member 5.

As material for sheet-like substrate 14, polyethylene terephthalate (PET) or polyethylene naphthalate (PEN), polyvinyl fluoride resin (PVF), or polyethylene (PE) may, for example, be employed. Furthermore, if heating to 200° C. or higher is carried out during manufacturing operations due to employment of solder at joint member 18 or for other such reason, polyimide (PI) or polyamide-imide (PAI), polyether ether ketone (PEEK), polytetrafluoroethylene (PTFE), polyethersulfone (PES), or other such resin excelling in heat resistance may be used.

Furthermore, conductive lead 15 may be formed on sheet-like substrate 14 by metal sputtering or etching, or by application of metal thin film. As metal material for forming conductive lead 15, it is possible, for example, to employ copper, aluminum, gold, or silver, or alloys containing these, and so forth.

Note that the size of film-type circuit 6 may be made the same as at least a plurality of solar cell elements 4. Film-type circuit 6 of such size will make it possible to achieve a large area corresponding to regions at which heating is not carried out notwithstanding that use of a soldering iron to carry out soldering causes some heating locally. This will therefore make it possible to reduce expansion and contraction of the entirety of film-type circuit 6, and will make it possible to reduce occurrence of warping even if the connected solar cell element 4 and film-type circuit 6 are cooled together.

Next, FIG. 5 (c) and FIG. 5 (d) will be employed to describe a variation on film-type circuit 6 of the present embodiment.

In the present variation, sheet-like substrate 14 of film-type circuit 6 has a multilayered structure employing a combination of the foregoing resin films. More specifically, as shown at FIG. 5 (c) and FIG. 5 (d), sheet-like substrate 14 has sheet-like layers 14a, 14c which are PET, PEN, or other such resin sheet members, and has moisture-resistant layer 14b arranged between said sheet-like layer 14a and sheet-like layer 14c. In addition, film-type circuit 6 has insulating film 17 which covers conductive lead 15 at locations other than contact region 15a. When a film-type circuit 6 such as that of this variation is employed, low-resistance metal or flux may be arranged on contact region 15a of conductive lead 15. That is, conductive lead 15 may have basal region 15b comprising the aforementioned metal, and may have contact region 15a comprising low-resistance metal or flux and arranged on basal region 15b located at the apical surface of convex portion 16.

By thus causing sheet-like substrate 14 to have multilayered structure, it is possible to improve moisture resistance and heat resistance, as well as electrical insulating characteristics and mechanical properties. Furthermore, by employing aluminum foil or galvanized iron foil, stainless steel foil, or a vapor-deposited layer of silica or alumina at moisture-resistant layer 14b, it is possible to improve long-term moisture-resistance of film-type circuit 6.

Moreover, by covering contact region 15a with gold or coating same in advance with flux for soldering, solar cell element 4 and conductive lead 15 can be electrically joined in favorable fashion. Furthermore, by causing PET or other such insulating film 17 covering conductive lead 15 at locations other than contact region 15a to be present, it is possible to reduce leakage current which occurs at places other than contact region 15a and flows from solar cell element 4 to conductive lead 15, permitting improvement of reliability and output.

Joint Member

Joint member 18 has the function of electrically and mechanically joining output-extracting electrode 10 of solar cell element 4 and conductive lead 15 of film-type circuit 6 at contact region 15a.

As such joint member 18, lead-containing solder or lead-free solder, or pastes made from such solders, or electrically conductive adhesive or the like may, for example, be employed.

Description will first be carried out with respect to a situation in which lead-containing solder or lead-free solder is employed at joint member 18. As lead-containing solder, eutectic Pb—Sn solder may, for example, be employed. Furthermore, as lead-free solder which is used for reduced environmental impact, from the standpoint of reducing deterioration of solar cell element 4 and film-type circuit 6 due to heat applied during joint formation, a substance having a low melting point may be used. Furthermore, with respect to other properties thereof, a lead-free solder which exhibits good wetting of electrodes, as well as high bond strength and fatigue strength, may be selected as appropriate. As such lead-free solder, low-/mid-temperature-type Sn—Zn or Sn—Zn—Bi, mid-temperature-type Sn—In—Ag—Bi or Sn—Ag—Bi—Cu, or high-/mid-temperature-type Sn—Ag—Cu or Sn—Ag may, for example, be selected. Moreover, to simplify manufacturing operations, it is possible to employ a conductive lead 15 having a structure such that contact region 15a has been covered in advance with solder, as described above. As joint member 18, note that solder paste, which is such that flux and/or vehicle has been added to solder powder made from such lead-containing solder and/or lead-free solder and this has been kneaded into a paste, may be employed.

Description will next be carried out with respect to a situation in which electrically conductive adhesive is employed at joint member 18. Electrically conductive adhesive includes metal filler 20a which serves to provide electrical conductivity, and binder resin 20b which serves to provide joint characteristics. More specifically, such an electrically conductive adhesive is obtained by kneading together metal filler 20a and binder resin 20b.

As material for metal filler 20a, it is possible to use gold, silver, copper, nickel, aluminum, carbon, graphite, or the like.

Furthermore, with regard to shape, metal filler 20a may, for example, be selected as appropriate from among substances in flake form, granular form, needle-like form, or in dendritic form having a plurality of branched metal filaments, and so forth. In particular, by using as metal filler 20a substances in flake form affording good surficial contact, or substances in dendritic form affording good mutual proximity throughout metal filler 20 and displaying good adhesion, it is possible to achieve reduced resistance at joint member 18. By employing a combination of substances in the form of various shapes as metal filler, it is possible to achieve satisfactory mutual connection between occurrences of metal filler, and to achieve good connection of binder resin 20b with output-extracting electrode 10 and conductive lead 15.

As binder resin 20b, substances capable of complying with deformations occurring due to stress loading, and of relieving stresses and withstanding cyclic thermal strains, may be employed. Due to the fact that joint member 18 must cure within the sealed regions between layers of film-type circuit 6 and solar cell element 4, a substance exhibiting little outgassing may be employed therefor. Moreover, from the standpoint of permitting reduction in thermal history at solar cell element 4 and film-type circuit 6, a substance that crosslinks and cures at low temperature may be used as binder resin 20b. Furthermore, from the standpoint of more accurately carrying out electrical connection between output-extracting electrode 10 and contact region 15a, the substance employed as binder resin 20b may have properties such that, after initiation of softening of non-light-receiving-side sealing member 5 during lamination, initiation of crosslinking takes place gradually, with crosslinking and curing being completed by the time that lamination is completed. The crosslinking temperature of binder resin 20b, e.g., if ethylene-vinyl acetate copolymer (EVA) is used at non-light-receiving-side sealing member 5, may be a temperature higher than approximately 70° C., which is the melting point of pre-crosslinked EVA. As such binder resin 20b, a one-part or two-part epoxy-type adhesive may be used. Furthermore, besides epoxy-type adhesives, it is possible to select binder resin 20b from among urethane-type adhesives and silicone-type adhesives, or from among acrylic-type adhesives or polyimide-type adhesives.

At joint member 18, note that instead of the aforementioned solder or electrically conductive adhesive, electrically conductive two-sided adhesive tape may be used. Because such adhesive tape permits mechanical and electrical connection, without application of heat, it can be pressed thereon and made to adhere when respective members are being layered together, permitting reduction in occurrence of poor electrical continuity between contact region 15a and output-extracting electrode 10 occurring due to misalignment of solar cell element 4 and conductive lead 15 before or during lamination.

Solar cell module 1 according to the first embodiment and having constitution as described above provides the following benefits.

It is generally desirable, from the standpoints of mechanical strength, reliability, and electrical resistance, that joint member 18 be formed so as to have a thickness which is less than that of first non-light-receiving-side sealing member 5. That is, it is desirable to make thickness of joint member 18 small and thus reduce the likelihood of occurrence of strength-related defects.

In the present embodiment, at sheet-like substrate 14 of film-type circuit 6, convex portion 16 on which conductive lead 15 is disposed is provided on one principal plane facing second surface 8b of solar cell element 4. This makes it possible for the thickness of joint member 18, which is located between conductive lead 15 and output-extracting electrode 10, to be made smaller than the thickness of first non-light-receiving-side sealing member 5.

This being the case, even where thickness of non-light-receiving-side sealing member 5 is made comparatively large, e.g., 0.3 mm to 0.8 mm in the present embodiment to protect solar cell element 4 as was described above, it is possible to reduce likelihood that joint member 18 will contain strength-related defects, and to increase mechanical strength of joint member 18 and improve reliability. That is, it will be possible to reduce the likelihood of occurrence of poor electrical continuity occurring due to the generation of crack of joint member 18 which due to concentration of stresses at the aforesaid defects due to thermal stress, wind pressure, loading due to accumulation of snow, and so forth accompanying usage of solar cell module 1 following installation. As a result, it will be possible to achieve improvement in reliability.

Furthermore, whereas causing output-extracting electrode 10 of solar cell element 4 to protrude from the non-light-receiving surface by a height corresponding to 0.3 mm to 0.8 mm, i.e., the thickness of non-light-receiving-side sealing member 5, in an attempt to cause contact to be made with conductive lead 15 would create difficulties for manufacture of solar cell element 4, the present embodiment makes solution of such problems possible. Or whereas causing conductive lead 15 of film-type circuit 6 to protrude in similar fashion by a height of 0.3 mm to 0.8 mm corresponding to the thickness of non-light-receiving-side sealing member 5 in an attempt to cause contact to be made with the output-extracting electrode of the solar cell element would, due to thickness of the conductive lead, cause increase in thermal stresses due to thermal expansion/contraction and would increase the number of materials used, the present application makes solution of such problems possible.

Note that whereas in the present embodiment, as shown at FIG. 3 (a), convex portion 16 at sheet-like substrate 14 is such that the entirety of film-type circuit 6 (sheet-like substrate 14 and conductive lead 15) is bent at the portion thereof corresponding to said convex portion 16, embodiments according to the present invention are not limited thereto. For example, in another embodiment, convex portion 16 may be formed on one principal plane of sheet-like substrate 14, while the surface of sheet-like substrate 14 which corresponds to the back surface relative to the one principal plane thereof may be made flat.

Furthermore, a solar cell module 1 employing electrically conductive adhesive at joint member 18 has a joint between output-extracting electrode 10 and contact region 15a as shown at FIG. 3 (b), as has been described above. More specifically, as shown at FIG. 3 (b), throughout electrically conductive adhesive of joint member 18, occurrences of metal filler 20a are respectively surrounded by binder resin 20b. For this reason, electrical continuity between output-extracting electrode 10 and conductive lead 15 by way of intervening joint member 18 takes place when there is dielectric breakdown of binder resin 20b between occurrences of metal filler 20a. This being the case, from the standpoint of decreasing resistance of joint member 18, output-extracting electrode 10 and conductive lead 15 should be brought into proximity, and the number of occurrences of metal filler 20a between output-extracting electrode 10 and contact region 15a should be reduced. Furthermore, in the present embodiment, from the standpoint of increasing reliability and lowering electrical resistance, it is desirable that gold, silver, or other such precious metal be employed as metal filler 20a. Because the present embodiment thus employs electrically conductive adhesive containing metal filler 20a and binder resin 20b at joint member 18, it is possible to maintain electrical conductivity while allowing deformations to occur in correspondence to stress. As a result, it is possible to better relieve concentration of stresses as compared with the situation in which solder or the like is employed as joint member 18.

Solar Cell Module According to Second Embodiment

Figure 6:
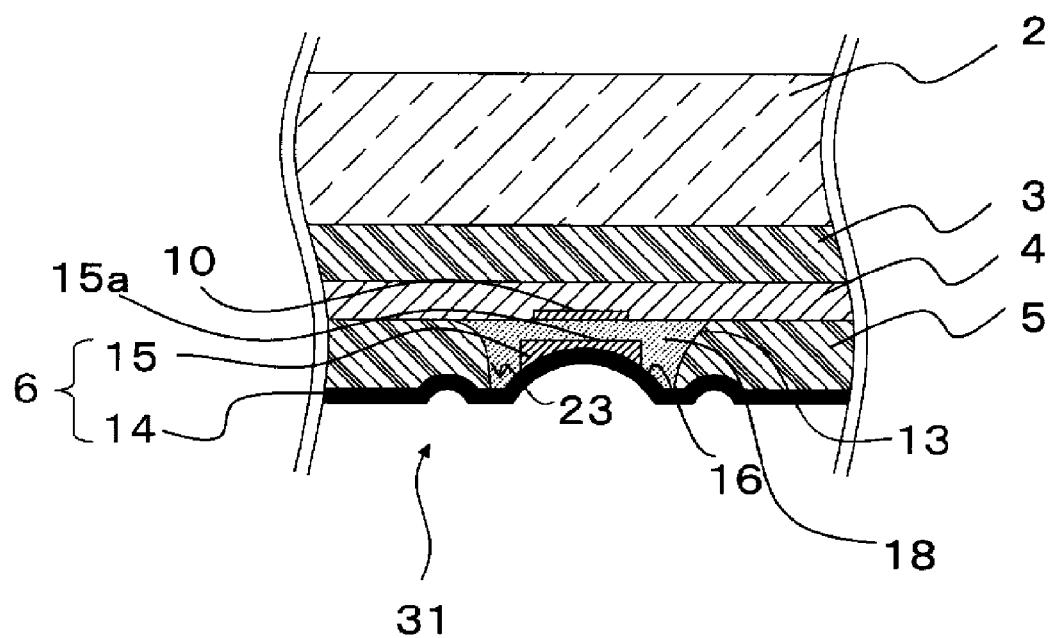
FIG. 6 is a partial enlarged cross-sectional view showing solar cell module 31 according to a second embodiment of the present invention.

Next, referring to FIG. 6, solar cell module 31 according to a second embodiment of the present invention will be described. As shown in FIG. 6, solar cell module according to the present embodiment differs from the first embodiment with respect to the fact that it has concave portion 23 at the periphery of convex portion 16 of sheet-like substrate 14.

More specifically, in the present embodiment, sheet-like substrate 14 also has concave portion 23 provided at the periphery of convex portion 16. As shown in FIG. 6, the concavity of said concave portion 23 is directed toward first non-light-receiving-side sealing member 5. Such concave portion 23 may be formed by a drawing operation, this being a type of plastic forming operation.

Provision of such concave portion 23 in the present embodiment makes it possible, if electrically conductive adhesive is employed as joint member 18, to reduce infiltration of regions between layers corresponding to first non-light-receiving-side sealing member 5 and film-type circuit 6 by joint member 18 (electrically conductive adhesive) during lamination. That is, where electrically conductive adhesive is employed as joint member 18, this makes it possible to reduce entry of uncured joint member 18 (electrically conductive adhesive) into regions between layers corresponding to non-light-receiving-side sealing member 5 and film-type circuit 6, the entry otherwise occurring due to pressure which is applied during lamination when lamination is being carried out. This makes it possible to increase adhesion between first non-light-receiving-side sealing member 5 and film-type circuit 6, and to improve reliability.

Solar Cell Module According to Third Embodiment

Next, referring to FIG. 10 (a) and FIG. 10 (b), solar cell module 41 according to a third embodiment of the present invention will be described.

Figure 10:
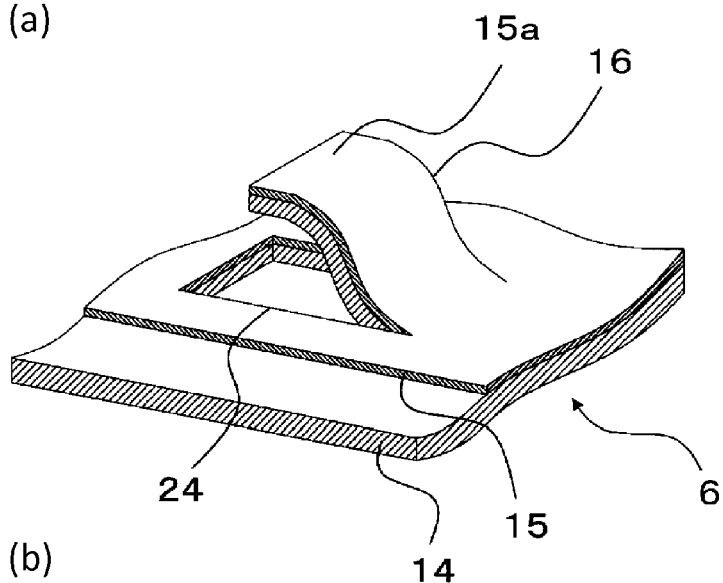
FIG. 10 is a group of drawings showing solar cell module 41 according to a third embodiment of the present invention, FIG. 10 (a) being an enlarged perspective view showing the periphery of the convex portion of the sheet-like substrate at film-type circuit, and FIG. 10 (b) being a cross-sectional view showing a location corresponding to FIG. 3 (c) of solar cell module 41 according to the third embodiment.
Figure 10:
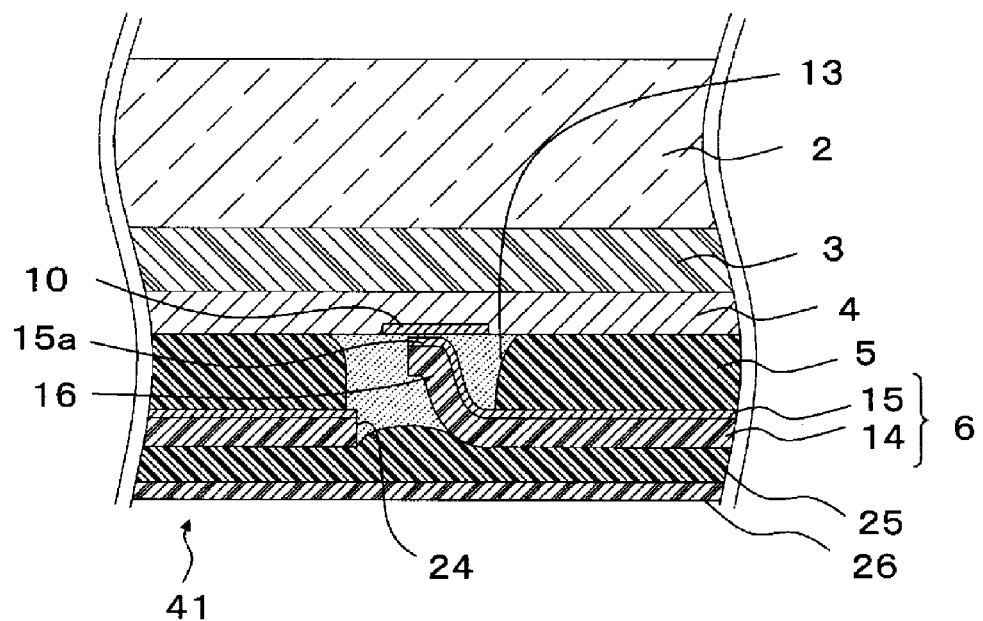

As shown at FIG. 10 (a), solar cell module 41 according to the present embodiment differs from the first embodiment with respect to the fact that sheet-like substrate 14 has slit portion 24 at the periphery of convex portion 16, and with respect to the fact that it has second non-light-receiving-side sealing member 25 and backside protective film 26.

More specifically, the dimensions of slit portion 24 may be such that it is more or less a partial rectangle, being on the order of approximately 1 mm to approximately 3 mm on a side, or it is roughly U-shaped, having radius on the order of approximately 1 mm to approximately 3 mm, or the like. In the present embodiment, sheet-like substrate 14 has concave portion 16 formed by slit portion 24. Such convex portion 16 may be formed by first employing a shearing operation, this being a type of plastic forming operation, to form slit portion 24 in sheet-like substrate 14, and then pushing said slit portion 24 upward and toward first non-light-receiving-side sealing member 5.

In the present working example as well, as has been described above, contact region 15a of conductive lead 15 disposed at the apical surface of convex portion 16 is electrically connected to output-extracting electrode 10 by way of joint member 18. At such time, as shown at FIG. 10 (b), convex portion 16 is arranged within through-hole 13 of first non-light-receiving-side sealing member 5. Accordingly, in the present embodiment, through-hole 13 should be somewhat larger in size than slit portion 24. For example, shape of through-hole 13 may be such that it is square or circular, diameter at the opening being on the order of approximately 2 mm to approximately 6 mm.

Furthermore, in the present embodiment, by using slit portion 24 provided at the periphery of contact region 15a to push out contact region 15a therefrom, it is possible to cause convex portion 16 having small area to be formed such that it protrudes from the surface of sheet-like substrate 14 by a large amount. This makes it possible, when arranging solar cell element 4 and film-type circuit 6, to cause distance between output-extracting electrode 10 and contact region 15a to be made small, and makes it possible to achieve stability in electrical contact between output-extracting electrode 10 and contact region 15a. As a result, it is possible to reduce the amount of electrically conductive adhesive used, to reduce contact resistance, and to increase electrical conductivity.

Because sheet-like substrate 14 at solar cell module 41 has slit portion 24 at the periphery of contact region 15a, it is possible for convex portion 16 to deform in conformance with expansion and contraction of the entirety of film-type circuit 6 and/or solar cell element 4. This makes it possible to relieve stresses that act in a direction which would otherwise cause delamination to occur between contact region 15a and output-extracting electrode 10. As a result, it is possible, for example, to relieve thermal stresses accompanying differences in coefficients of thermal expansion at solar cell element 4 and film-type circuit 6, and to reduce stresses that have said thermal stresses as their cause and that may otherwise tend to result in curvature of solar cell element 4.

Moreover, as described above, it is possible in the present embodiment to cause there to be a large difference in the height of the surface of sheet-like substrate 14 and the height of the apical surface of conductive lead 15. For this reason, by providing slit portion 24, it is possible, when subjecting film-type circuit 6 to working with a press to form convex portion 16, to reduce the tendency for the thickness of conductive lead 15 to become too small.

Also, as described above, because it is possible in the present embodiment to cause the area at the apical surface of convex portion 16 to be made small, it is possible to cause the area of the opening of through-hole 13 provided at first non-light-receiving-side sealing member 5 to be made small. This makes it possible to increase the area over which adhesion takes place between solar cell element 4 and first non-light-receiving-side sealing member 5, and between film-type circuit 6 and first non-light-receiving-side sealing member 5, making it possible to achieve increased module strength. Furthermore, by reducing the area of the opening of through-hole 13, it is possible to reduce the amount of electrically conductive adhesive at joint member 18 which fills through-hole 13, making it possible to reduce the amount of silver or other such expensive rare metal which is used as filler.

Moreover, in the present embodiment, joint member 18 covers the periphery of slit portion 24. This increases reliability in the electrical connection between solar cell element 4 and conductive lead 15.

Note that, in the present embodiment, second non-light-receiving-side sealing member 25 has the function of protecting film-type circuit 6 by way of the non-light-receiving side of solar cell module 1, while backside protective film 26 has the function of protecting the non-light-receiving side of second non-light-receiving-side sealing member 25.

Solar Cell Module According to Fourth Embodiment

Next, referring to FIG. 11, solar cell module 51 according to a fourth embodiment of the present invention will be described.

Figure 11:
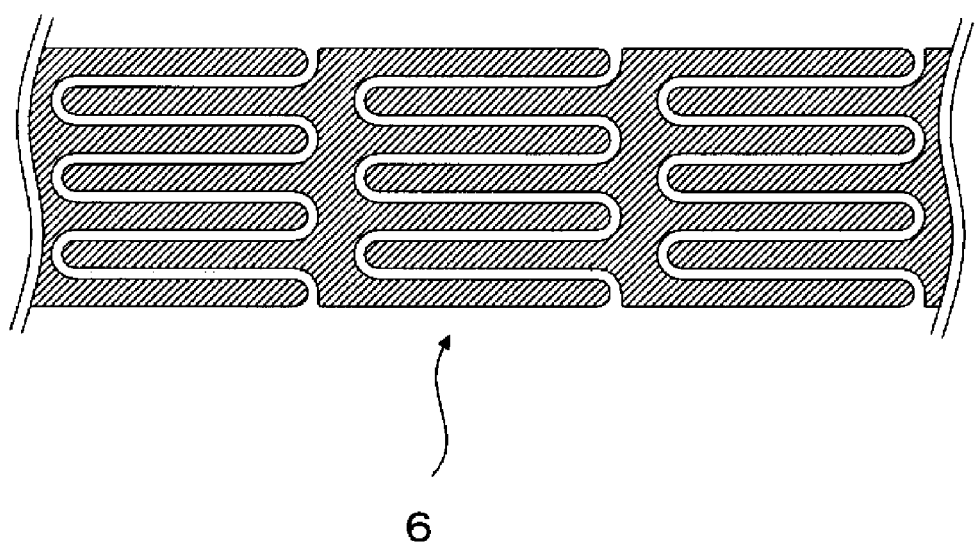
FIG. 11 is a perspective view showing the film-type circuit at solar cell module 51 according to a fourth embodiment of the present invention.

As shown in FIG. 11, solar cell module 41 according to the present embodiment differs from the first embodiment with respect to the fact that film-type circuit 6 comprises a single layer of electrically conductive metal, and with respect to the fact that conductive lead 15 and sheet-like substrate 14 are constituted in integral fashion.

A sheet of copper or aluminum fashioned into the electrical circuitry of conductive leads 15 by means of diecutting may be used as such film-type circuit 6, the sheet-like conductive leads 15 obtained functioning as sheet-like substrate 14. This will make it possible to eliminate the need to form sheet-like substrate 14 from separate material, making it possible to achieve improved economy with respect to material used for sheet-like substrate 14.

Below, methods for manufacturing solar cell modules according to embodiments of the present invention are described.

Description will first be carried out with respect to situations in which solder is used at joint member 18 in the context of methods for manufacturing solar cell modules according to a fifth embodiment and a sixth embodiment. Furthermore, description will be carried out with respect to a situation in which electrically conductive adhesive is used at joint member 18 in the context of a method for manufacturing a solar cell module according to a seventh embodiment.

Solar Cell Module Manufacturing Method According to Fifth Embodiment

Operation for Preparing First and Second Solar Cell Elements 4a, 4b

First and second solar cell elements, provided with semiconductor substrate having a first surface which receives light and a second surface which corresponds to the back surface of the first surface, and provided with an output-extracting electrode located on the second surface, are prepared. More specifically, first and second solar cell elements 4a, 4b having the aforementioned constitution, for example, are prepared. Such solar cell element 4 may be manufactured as appropriate using known methods.

Operation for Preparing and Perforating First Non-Light-Receiving-Side Sealing Member Material (Sealing Member Sheet)

Through-holes extending from front surface to back surface are formed in sealing member material having a front surface and a back surface. Here, in what follows, light-receiving-side sealing member 3 and first non-light-receiving-side sealing member 5 as they exist before being subjected to heat treatment and combined in integral fashion to constitute solar cell module 1 are respectively referred to as light-receiving-side sealing member sheet 3a and first non-light-receiving-side sealing member sheet 5a. That is, light-receiving-side sealing member sheet 3a and first non-light-receiving-side sealing member sheet 5a are respectively precursors of light-receiving-side sealing member 3 and first non-light-receiving-side sealing member 5; in other words, these are respectively material for light-receiving-side sealing member 3 and material for first non-light-receiving-side sealing member 5.

To fabricate first non-light-receiving-side sealing member sheet 5a, a sealing member sheet made, for example, from organic compound having ethylene-vinyl acetate copolymer (EVA) or polyvinyl butyral (PVB) as primary constituent is prepared. The aforementioned sealing member sheet may contain organic peroxide as crosslinking agent. This sealing member sheet is perforated from front surface to back surface, providing through-holes 13 therein, to prepare first non-light-receiving-side sealing member sheet 5a. Through-holes 13 should be provided at locations on the sealing member sheet such as will cause them to be opposed to output-extracting electrodes 10 of solar cell element 4. Through-holes 13 may, for example, be provided in the sealing member sheet by subjecting it to diecutting using a Thomson die.

Note that whereas sheet-like members were used as respective sealing member materials in the present embodiment, the dimensions of the sealing member material are not limited hereto. For example, sealing member material may be aforementioned EVA or the like with which surface(s) of member(s) where sealing member(s) are to be disposed (in the present embodiment, plurality of solar cell elements 4) are coated. In such case, what is meant by providing through-holes 13 is that a mask corresponding to the dimensions of through-holes 13 is arranged on the surface of the member(s) from which the sealing member will be formed, and EVA or the like is applied thereto and this is allowed to dry, to form the sealing member having through-holes 13.

Aligning Operation

Figure 7:
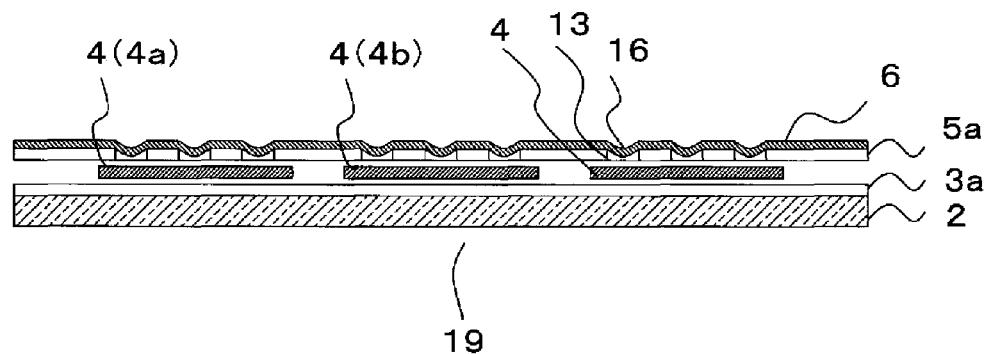
FIG. 7 (a) is a cross-sectional view showing a module laminate stack during the course of manufacturing a solar cell module in accordance with the present invention.
Figure 7:
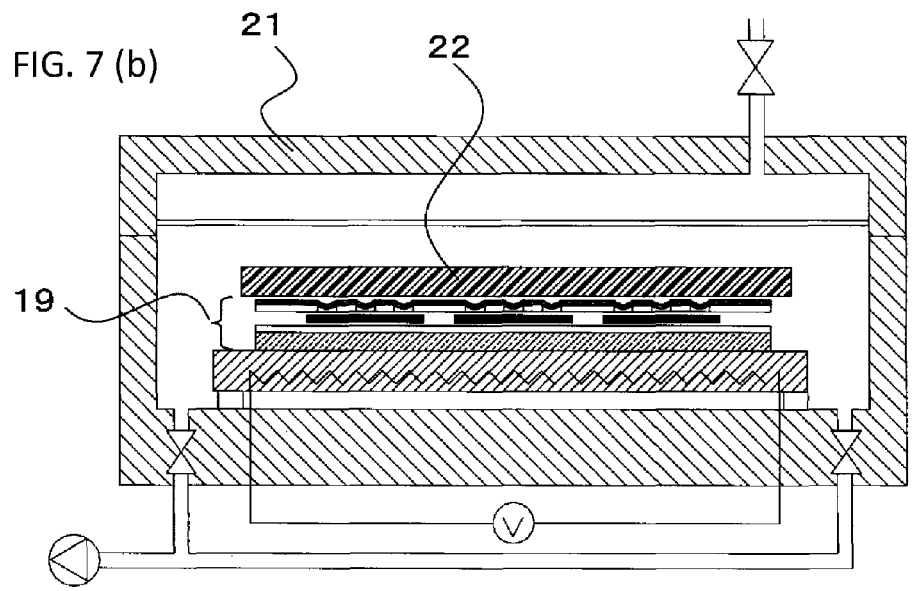

First, as shown at FIG. 7 (a), light-receiving-side sealing member sheet 3a is placed on the non-light-receiving side of translucent substrate 2, and solar cell elements 4 are arrayed on that light-receiving-side sealing member sheet 3a. Next, non-light-receiving-side sealing member sheet 5a is placed over solar cell elements 4, being positioned with respect thereto in such fashion as to cause output-extracting electrodes 10 of solar cell elements 4 and through-holes 13 of first non-light-receiving-side sealing member sheet 5a to be mutually opposed. In addition, film-type circuit 6 is made to overlap first non-light-receiving-side sealing member sheet 5a, being positioned with respect thereto in such fashion as to cause convex portions 16 of sheet-like substrate 14 to enter through-holes 13 of first non-light-receiving-side sealing member sheet 5a, and cause contact regions 15a of conductive leads 15 and output-extracting electrodes 10 of solar cell elements 4 to be mutually opposed. As a result, module laminate stack 19 having translucent substrate 2, light-receiving-side sealing member sheet 3a, solar cell elements 4, first non-light-receiving-side sealing member sheet 5a, and film-type circuit 6 is formed.

Connecting Operation

Next, output-extracting electrodes 10 of solar cell elements 4 and contact regions 15a of conductive leads 15 at film-type circuit 6 are mutually electrically connected by means of joint members 18. Output-extracting electrodes 10 and contact regions 15a can be mutually electrically connected by means of soldering, for example. For example, such soldering may be carried out by melting solder with which contact regions 15a have been covered in advance. At such time, such soldering may be carried out by using a soldering iron, hot air, YAG laser, or other such heating means to apply heat to joint members 18 (solder) covering contact regions 15a past sheet-like substrate 14.

Here, if a soldering iron or hot air is employed as heating means, to reduce damage due to heating the aforementioned polyimide or polyamide-imide, polyether ether ketone, polytetrafluoroethylene, or polyethersulfone may be used as sheet-like substrate 14.

Furthermore, if a YAG laser is employed as heating means, a transparent sheet-like member may be employed as sheet-like substrate 14 of film-type circuit 6 so as to allow contact regions 15a to be irradiated by the YAG laser from the backside of sheet-like substrate 14.

In the manufacturing method according to the present embodiment, the heat treatment operation may, for example, have a laminating operation and a crosslinking operation, as described below.

Laminating Operation

Next, as shown at FIG. 7 (b), laminator 21 is used to apply pressure to and carry out heat treatment of the aforementioned module laminate stack 19 while this is being degassed under vacuum conditions. As a result of this heat treatment, melted light-receiving-side sealing member sheet 3a and first non-light-receiving-side sealing member sheet 5a are made to mutually adhere, causing light-receiving-side sealing member 3 and first non-light-receiving-side sealing member 5 to be formed, as a result of which the layers of module laminate stack 19 are made to mutually adhere, so that the respective members therein are made to constitute an integral structure.

At the present operation, application of pressure may take place with heat-resistant soft resin 22 placed over film-type circuit 6 in module laminate stack 19. As soft resin 22, acrylic gel or silicone gel that is heat resistant and has a penetrometer reading of 50 to 200 may be employed. By thus using soft resin 22 having high flexibility, this will facilitate application of pressure in uniform fashion by soft resin 22 with respect to interior walls of convex portions 16. This will make it possible to reduce occurrence of cracking and so forth of solar cell elements 4 that would otherwise occur in accompaniment to concentration of stresses during lamination, while at the same time achieving stability in contact between output-extracting electrodes 10 and contact regions 15a, and will make it possible for first non-light-receiving-side sealing member sheet 5a to fill the space between solar cell elements 4 and film-type circuit 6 so that no bubbles remain within through-holes 13.

Crosslinking Operation

Following lamination of module laminate stack 19, a crosslinking oven is used to apply heat thereto until crosslinking at light-receiving-side sealing member 3 and first non-light-receiving-side sealing member 5 is not less than 90%. A heating temperature of 120° C. to 150° C. may, for example, be maintained at this time. Following heat treatment of module laminate stack 19, terminal box 7 comprising polyphenylene ether resin or the like is then secured to the non-light-receiving side thereof by means of adhesive. In this way, solar cell module 1 is manufactured.

Employment of a method of manufacturing solar cell module 1 as described above makes it possible to provide joint members 18 of appropriate thickness between film-type circuit 6 and output-extracting electrodes 10 of solar cell elements 4, and permits manufacture of a solar cell module 1 which has good reliability and in which high mechanical strength is ensured. That is, it is possible to cause the thickness of joint member 18 which is located between conductive lead 15 and output-extracting electrode 10 of solar cell element 4 to be smaller than the thickness of non-light-receiving-side sealing member 5 which is disposed between solar cell element 4 and film-type circuit 6. As a result, it is possible by means of a simple structure to increase the strength of the joint between the solar cell element and the conductive lead, and to reduce occurrence of cracking and delamination which tends to occur at the joint member when the joint member is too thick.

Furthermore, because there is no need to use multiple strips of copper foil or the like to electrically connect each individual solar cell element 4, this makes it possible to improve manufacturing efficiency.

Solar Cell Element Manufacturing Method According to Sixth Embodiment

A method for manufacturing a solar cell module according to a sixth embodiment of the present invention will now be described. The solar cell module manufacturing method according to the present embodiment differs from the fifth embodiment with respect to the fact that a soldering operation is carried out following the laminating operation.

More specifically, soldering is carried out by using a soldering iron, hot air, or YAG laser to apply heat to joint members 18 (solder) covering contact regions 15a past sheet-like substrate 14 from the side thereof at which film-type circuit 6 is present.

Due to the fact that this soldering operation is carried out following the laminating operation, at the time that the soldering operation is carried out, solar cell element 4 is such that the space between light-receiving-side sealing member 3 and first non-light-receiving-side sealing member 5 is filled, causing this to assume a secured state. This makes it possible to reduce occurrence of warpage accompanying differences in coefficients of thermal expansion at film-type circuit 6 and solar cell element 4. Furthermore, in the present embodiment, because the soldering operation is carried out following the laminating operation, it is possible to minimize the effect of heat on light-receiving-side sealing member 3 and first non-light-receiving-side sealing member 5 during soldering. For example, it is possible to reduce melting and so forth of light-receiving-side sealing member 3 and first non-light-receiving-side sealing member 5 that would otherwise take place during the soldering operation.

Solar Cell Module Manufacturing Method According to Seventh Embodiment

A method for manufacturing a solar cell module according to a seventh embodiment of the present invention will now be described. The solar cell module manufacturing method according to the present embodiment differs from the fifth embodiment with respect to the fact that it may be applied where electrically conductive adhesive is employed at joint member 18, and with respect to the fact that the connecting operation and the heat treatment operation are carried out in a single operation. What is meant by the fact that the connecting operation and the heat treatment operation are carried out in a single operation is that, to be more specific, at least the connecting operation and the laminating operation and the crosslinking operation are carried out in a single operation. Below, description is carried out with respect to those aspects which differ from the fifth embodiment.

Aligning Operation

Figure 9:
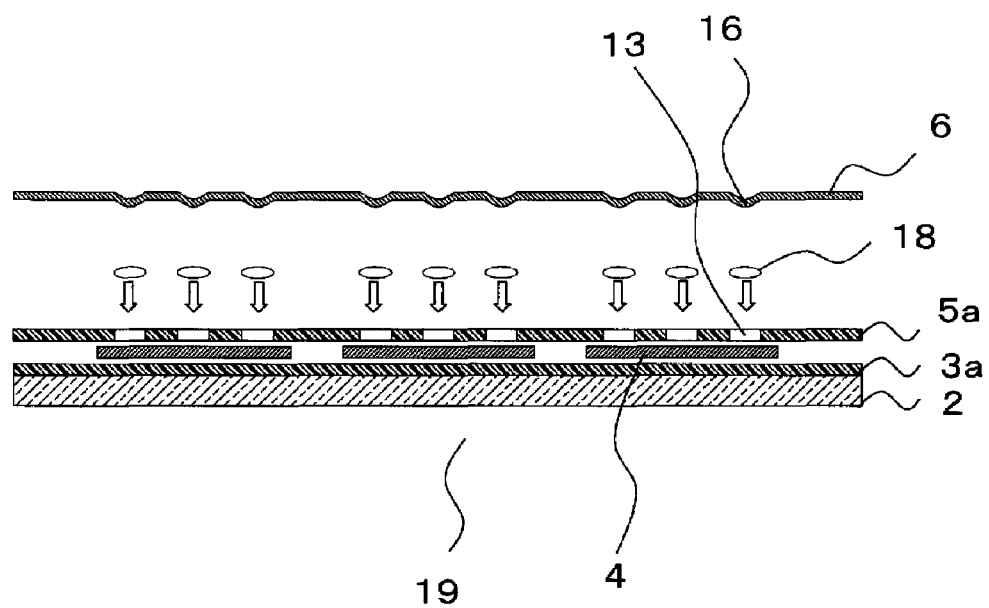
FIG. 9 is a cross-sectional view showing a method for manufacturing a solar cell module according to a seventh embodiment of the present invention.

First, as shown in FIG. 9, light-receiving-side sealing member sheet 3a is placed on the non-light-receiving side of translucent substrate 2, and solar cell elements 4 are arrayed over that light-receiving-side sealing member sheet 3a. Next, non-light-receiving-side sealing member sheet 5a is placed above solar cell elements 4 in such fashion as to cause output-extracting electrodes 10 of solar cell elements 4 and through-holes 13 of first non-light-receiving-side sealing member sheet 5a to be mutually opposed. Paste-like joint member 18 (electrically conductive adhesive) is then injected into the interiors of the through-holes 13 on output-extracting electrodes 10 which oppose through-holes 13. Next, film-type circuit 6 is made to overlap first non-light-receiving-side sealing member sheet 5a in such fashion as to cause convex portions 16 of film-type circuit 6 to enter through-holes 13, and cause contact regions 15a and output-extracting electrodes 10 to be mutually opposed. As a result, module laminate stack 19 is formed.

Laminating Operation

Next, laminator 21 is used to apply heat and pressure to module laminate stack 19 while this is being degassed by means of vacuum. As a result, the layers of module laminate stack 19 are made to mutually adhere, causing the respective members therein to constitute an integral structure. At this time, in the present embodiment, crosslinking and curing of joint member 18 (electrically conductive adhesive) also causes contact regions 15*a* and output-extracting electrodes 10 to be mutually electrically connected. That is, the present operation also serves to carry out the connecting operation according to the fifth embodiment.

Figure 8:
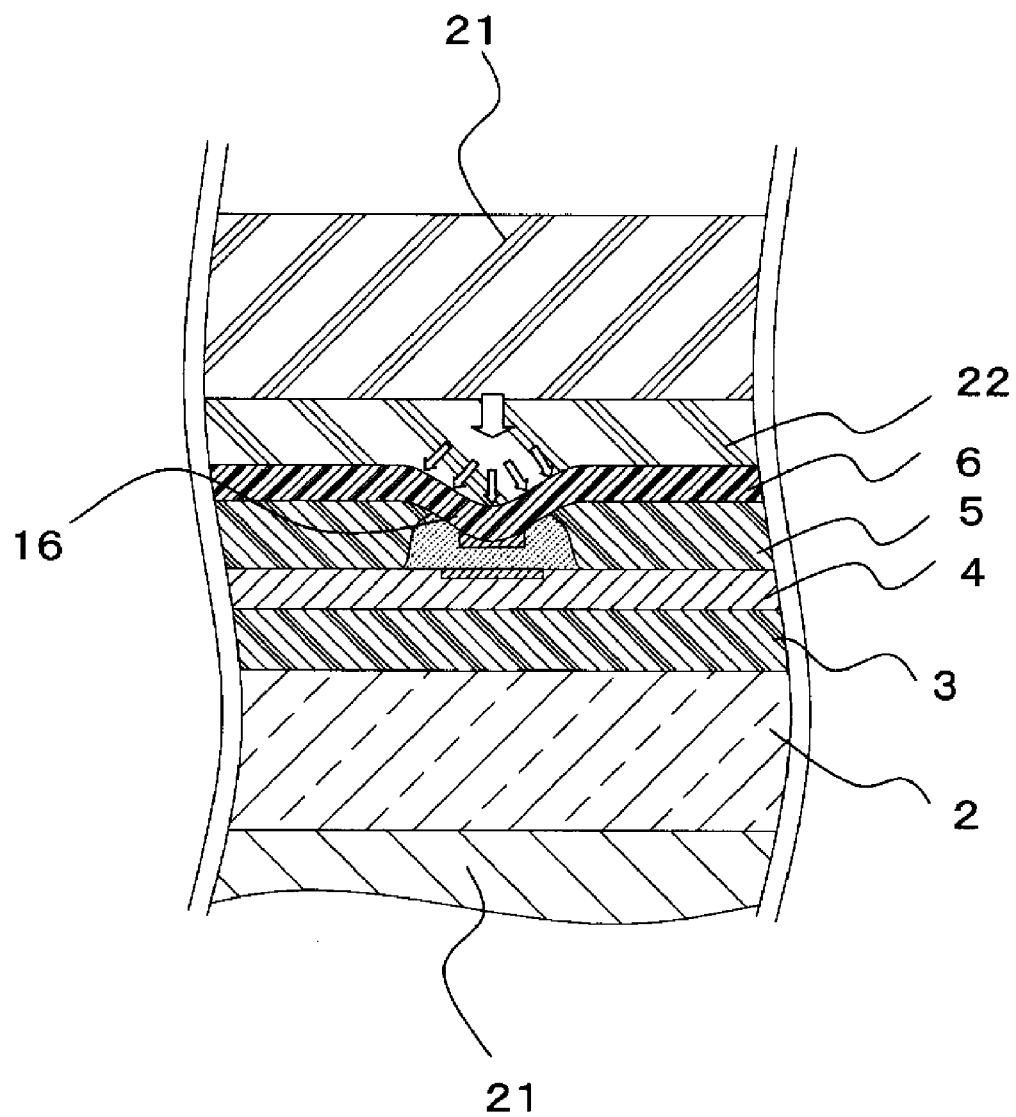
FIG. 8 is a drawing for explaining a method for manufacturing a solar cell module according to a seventh embodiment of the present invention.

Furthermore, in the present embodiment, by using electrically conductive adhesive at joint member 18 and using soft resin 22 having high flexibility, Pascal's Law operates as shown in FIG. 8 to increase the homogeneity with which soft resin 22 applies pressure on interior walls of convex portions 16. As a result, it is possible to reduce occurrence of cracking at solar cell elements 4 that would otherwise occur in accompaniment to concentration of stresses, and to improve reliability of contact between output-extracting electrodes 10 and contact regions 15*a*.

Note that whereas the present embodiment was described in terms of an example in which the connecting operation and the laminating operation and the crosslinking operation were carried out in a single operation, this being one example of a situation in which the connecting operation and the heat treatment operation are carried out in a single operation, there is no objection to carrying out the crosslinking operation separately from the connecting operation. That is, the crosslinking operation may, where appropriate, be carried out at the same operation as the connecting operation.

Whereas solar cell modules and solar cell module manufacturing methods according to embodiments of the present invention have been described above in terms of specific examples, it goes without saying that the present invention is not limited to the foregoing embodiments.

For example, solar cell modules according to other embodiments of the present invention may employ various combinations of the foregoing embodiments.

DESCRIPTION OF THE REFERENCE SYMBOLS

1, 31, 41 Solar cell module
2 Translucent substrate
3 Light-receiving-side sealing member
3*a* Light-receiving-side sealing member sheet
4 Solar cell element
4*a* First solar cell element
4*b* Second solar cell element
5 First non-light-receiving-side sealing member
5*a* First non-light-receiving-side sealing member sheet
6 Film-type circuit
7 Terminal box
8*a* First surface (light-receiving surface)
8*b* Second surface (non-light-receiving surface)
9 Semiconductor substrate
10 Output-extracting electrode
11 Current-collecting electrode
12 hole
13 Through-hole
14 Sheet-like substrate
14*a*, 14*c* Sheet-like layers
14*b* Moisture-resistant layer
15 Conductive lead
15*a* Contact region
15*b* Basal region
16 Convex portion
17 Insulating film
18 Joint member
19 Module laminate stack
20*a* Metal filler
20*b* Binder resin
21 Laminator
22 Soft resin
23 Concave portion
24 Slit portion
25 Second non-light-receiving-side sealing member
26 Backside protective film

The invention claimed is:

1. A solar cell module, comprising:
a plurality of solar cell elements comprising a first solar cell element and a second solar cell element, each of the solar cell elements comprising:
  a semiconductor substrate comprising:
    a first surface that receives light; and
    a second surface corresponding to a back surface of the first surface; and
  an output-extracting electrode located on the second surface;
a sealing member disposed on the second surfaces of the plurality of solar cell elements and comprising a plurality of through-holes, wherein the plurality of through holes comprises a first through-hole and a second through-hole; and
a film-type circuit disposed on the sealing member, wherein the film-type circuit comprises:
  a sheet-like insulating substrate comprising a plurality of insulating convex portions corresponding to the plurality of through-holes, wherein each insulating convex portion protrudes toward the second surface and into each of the plurality of through-holes; and
  a conductive lead disposed on an apical surface of at least a first insulating convex portion and a second insulating convex portion of the plurality of insulating convex portions;
wherein the film type circuit electrically connects the first solar cell element and the second solar cell element adjacent to the first solar cell element by way of a first joint member disposed within the first through-hole and electrically connecting the output-extracting electrode of the first solar cell element to the conductive lead disposed on the apical surface of the first insulating convex portion and a second joint member disposed within the second through-hole and electrically connecting the output-extracting electrode of the second solar cell element to the conductive lead disposed on the apical surface of the second insulating convex portion.

2. The solar cell module according to claim 1, wherein the sheet-like insulating substrate further comprises a concave portion at a periphery of the insulating convex portion.

3. The solar cell module according to claim 1, wherein the first joint member covers a periphery of the first insulating convex portion.

4. The solar cell module according to claim 1, wherein the sheet-like insulating substrate further comprises a slit-like portion at a periphery of the insulating convex portion.

5. The solar cell module according to claim 4, wherein the first joint member covers the slit-like portion.

* * * * *